United States Patent [19]

Sali

[11] Patent Number: 5,612,641
[45] Date of Patent: Mar. 18, 1997

[54] CIRCUIT FOR COVERING INITIAL CONDITIONS WHEN STARTING-UP AN INTEGRATED CIRCUIT DEVICE

[75] Inventor: Mauro L. Sali, S. Angelo Lodigiano, Italy

[73] Assignee: SGS-Thomson Microelectronics S.r.l., Agrate Brianza, Italy

[21] Appl. No.: 380,309

[22] Filed: Jan. 30, 1995

[30] Foreign Application Priority Data

Jan. 31, 1994 [EP] European Pat. Off. .............. 94830031

[51] Int. Cl.$^6$ ...................................... H03L 7/00
[52] U.S. Cl. ............................ 327/143; 327/198
[58] Field of Search ..................... 327/142, 143, 327/530, 544, 198, 399, 545, 546

[56] References Cited

U.S. PATENT DOCUMENTS

| | | | |
|---|---|---|---|
| 4,581,552 | 4/1986 | Womack et al. | 327/142 |
| 4,746,822 | 5/1988 | Mahoney | 327/142 |
| 5,039,875 | 8/1991 | Chang | 327/143 |
| 5,115,146 | 5/1992 | McClure | 327/143 |
| 5,349,244 | 9/1994 | Confalonieri | 327/143 |
| 5,374,923 | 12/1994 | Sakamoto | 327/143 |

FOREIGN PATENT DOCUMENTS

| | | | |
|---|---|---|---|
| A-0426351 | 5/1991 | European Pat. Off. | H03K 17/22 |
| A-0503803 | 9/1992 | European Pat. Off. | H03K 17/22 |
| A-0530159 | 3/1993 | European Pat. Off. | H03K 17/22 |
| A-0549378 | 6/1993 | European Pat. Off. | H03K 17/22 |
| A-4122978 | 2/1992 | Germany | H03K 17/22 |

*Primary Examiner*—Timothy P. Callahan
*Assistant Examiner*—Kenneth B. Wells
*Attorney, Agent, or Firm*—David M. Driscoll; James H. Morris; Brett N. Dorny

[57] ABSTRACT

A circuit for resetting initial conditions upon starting of an integrated circuit device has null current consumption under normal operating conditions. The circuit includes an input stage, which is a threshold circuit, and pilots through an input node an output stage which is a trigger circuit with hysteresis. The input node of the output stage is connected to ground through a condenser and is connected through a transistor to a connection node between a condenser and a diode connected transistor which are inserted between the power supply and ground. The gate terminal of the first transistor is grounded.

9 Claims, 1 Drawing Sheet

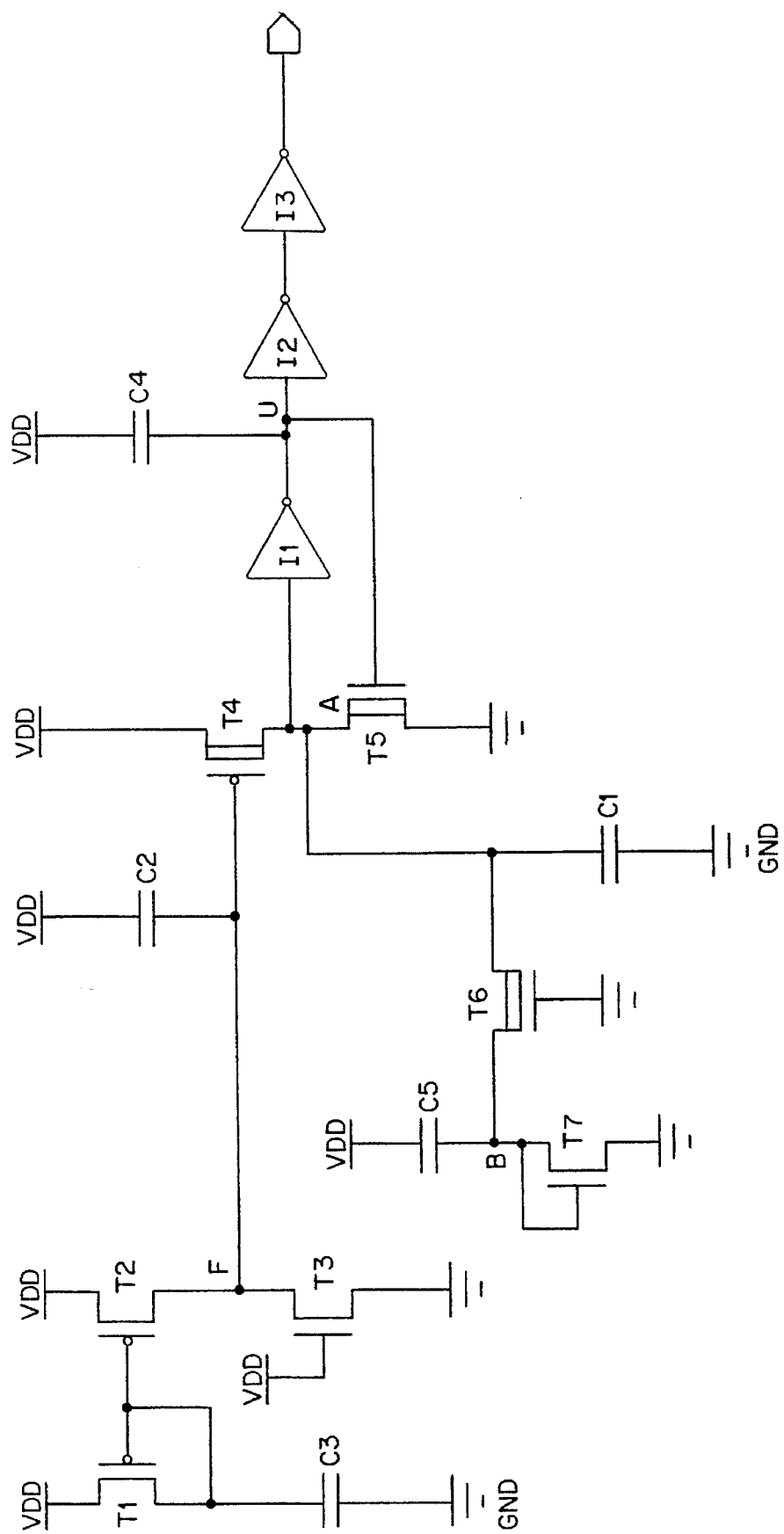

CIRCUIT FOR COVERING INITIAL CONDITIONS WHEN STARTING-UP AN INTEGRATED CIRCUIT DEVICE

BACKGROUND OF THE INVENTION

1. Field of the Invention

The present invention relates to command signal generator circuits, and more particularly to a command signal generator circuit for resetting initial conditions in a CMOS integrated circuit.

2. Discussion of the Related Art

In a broad variety of integrated circuit devices there are required operations for resetting the devices to initial conditions which are pre-set upon starting of the device. For example, the logic states in memory devices may be zeroed or reset.

If no special signal from the outside of the device is available, there must be provided a circuit designed to generate a command signal in the integrated circuit to cause initiation of the required resetting operations.

The command circuit is required to intervene not only upon starting the device but also whenever the supply voltage falls beneath a minimum level thereby jeopardizing the performance of the device.

The type of circuit for resetting a device to initial operating conditions is generally termed a "power-on reset" circuit in the technical literature. The acronym POR is derived from this circuit name and is also used.

A power-on reset circuit generates an output pulse when an input voltage signal (VDD) exceeds a first pre-set voltage. The power-on reset circuit also has hysteresis, i.e., the circuit repositions itself under initial conditions and is thus capable of generating a new pulse every time the input voltage signal (VDD) falls below a second preset voltage determined also on the basis of design parameters.

Upon starting of the device, this circuit finds an immediate application, as mentioned, as an automatic and internal generator, of a reset pulse in an integrated circuit.

A power-on reset circuit is a circuit which reads rise or fall ramps on the supply voltage and generates a pulse at a pre-set point on the ramps.

The basic characteristics of this type of circuit are the following.

The reset pulse must be generated independently of the rise and fall time of the supply voltage. These times vary typically by a few tenths of a msec to a few nsec. In addition, a circuit of this type must react correctly to a highly oscillating input waveform during settling time to the final pre-set value.

The minimum time necessary for the circuit to be able to generate a new pulse is called "recovery time".

The minimum time necessary from supply voltage fall to permit regeneration of a new pulse is called "minimum VDD break time".

Minimum current consumption is important when the device is under so-called standby conditions and this aspect is very important especially for CMOS devices. The so-called standby conditions refer to normal operating conditions of the CMOS devices while the voltage supply (VDD) is stable.

The lower voltage threshold to which the supply voltage must fall to permit the POR circuit to generate a new reset pulse for the device is called "minimum VDD bump".

Indeed, there must be generated new power-on pulses when the supply voltage falls below a minimum value for which it can no longer be said that the device is holding correct initial conditions.

One of the drawbacks of this type of circuit is that it is difficult to provide a power-on reset circuit with null current draw under stand-by conditions while achieving the other characteristics such as minimum VDD break time and VDD bump.

To meet these requirements those skilled in the art have conceived and implemented numerous power-on reset circuits with different technologies linked to the different types of devices.

One possible embodiment in CMOS technology is described, e.g., in U.S. Pat. No. 4,888,497 of this applicant.

A mixed technology embodiment is indicated in European Patent Application Ser. No. 92830336.1 also by this applicant.

SUMMARY OF THE INVENTION

In one embodiment, a power-on reset circuit comprises a threshold circuit for which the input signal is the device supply voltage. The threshold circuit pilots a trigger circuit with hysteresis downstream of which are connected circuits for formation of the output signal which are generally inverters which make the edges of the generated signals or pulses steeper.

One object of the present invention is to provide a power-on reset circuit for resetting initial conditions in an integrated circuit device with null absorption of current on standby, i.e., when the supply voltage is at a stable level of correct operation of the device a minimum amount of current is required by the power-on reset circuit.

Another object of the present invention is to provide a POR circuit implementable with CMOS technology and usable in EPROM memory devices, and to have quick and reliable operation under all dynamic starting conditions of the device in which it is inserted.

Another embodiment of the invention is a reset circuit for resetting initial conditions of an integrated circuit device disposed between a first supply terminal and a second supply terminal for coupling to a generator of a supply voltage variable from a null-value to a preset value. The reset circuit includes an input stage having a first input terminal and a second input terminal coupled to the first supply terminal and the second supply terminal, respectively, and an output terminal. The input stage is a threshold circuit designed to pilot the output stage when the supply voltage exceeds a preset threshold value. The reset circuit further includes an output stage having an input node for generation with hysteresis of command signals and a positive feedback loop coupled to the second supply terminal, the output terminal of the input stage being coupled to the input node. The reset circuit further includes a first capacitive element coupled between the input node and the second supply terminal thereby coupling the input node to the second supply terminal. The reset circuit also has a first transistor coupled between a second node and the input node. The first transistor has a command terminal coupled to the second supply terminal. The reset circuit also has a second capacitive element coupled between the second node and the first supply terminal. Additionally, the reset circuit has a second transistor coupled between the second node and the second supply terminal, the second transistor having a command terminal coupled to the second node.

In another embodiment of the invention, the first transistor is N-channel and is the native type (i.e., natural or enhancement type). In another embodiment of the invention, the second transistor is N-channel and is coupled between the second node and the second supply terminal by means of source and drain terminals. In another embodiment of the invention, the transistor has an operating threshold that is lower than an operating threshold of the second transistor. In another embodiment of the invention, the first capacitive element is interconnected between the input node of the output stage and the second terminal. In another embodiment of the invention, both the first and second capacitive elements are condensers. In another embodiment of the reset circuit, the input stage further includes a third transistor in series with a third capacitive element, the third transistor and the third capacitive element being disposed between the first supply terminal and the second supply terminal; a fourth transistor in series with a fifth transistor having a gate terminal connected to the first supply terminal, the fourth transistor and fifth transistor being disposed between the first supply terminal and the second supply terminal, the third transistor and the fourth transistor being configured as a current mirror circuit configuration; a sixth transistor coupled between the first supply terminal and the input node of the output stage, a gate terminal of the sixth transistor being coupled to a third node between the fourth transistor and the fifth transistor; and a fourth capacitive element coupled between the third node and the first supply terminal. In another embodiment of the invention, both the third and fourth capacitive elements are condensers, and both the fourth and sixth transistors are the native type. In another embodiment of the invention, the output stage further includes a first converter circuit coupled between the input node and an output node, the output node being coupled to the first supply terminal through a fifth capacitive element, the output node being further coupled to a gate terminal of a seventh transistor disposed between the input node and the second supply terminal. In another embodiment of the invention, the fifth capacitive element is a condenser, and the seventh transistor is the native type. In another embodiment of the invention, the reset circuit further includes a second and third inverter coupled in a cascade manner to the output node. In another embodiment of the invention, the reset circuit uses CMOS technology.

Another embodiment of the invention is directed to a reset circuit for generating an output signal having a first state that enables normal operation of a receiving circuit, and a second state that resets the receiving circuit, the receiving circuit having a first supply terminal for receiving a supply voltage from a voltage supply source and second supply terminal for receiving a reference voltage from the voltage supply source. The reset circuit includes an output stage responsive to a control signal, the output stage having a control node that receives the control signal, and an output node that generates the output signal according to the control signal. The reset circuit further includes a first condenser having a first end coupled to the control node, and a second end coupled to the second supply terminal. The reset circuit also includes a charging stage responsive to a potential difference between the supply voltage and the reference voltage, the charging stage having an input terminal coupled to the first supply terminal, and a charging terminal coupled to the control node, the charging stage charging the first condenser when the potential difference increases above a predetermined value. The reset circuit also includes a discharging stage responsive to the potential difference, the discharging stage having an input terminal coupled to the first supply terminal, and a discharging terminal coupled to the control node, the discharging stage discharging the first condenser when the potential difference decreases below a second predetermined value.

Another embodiment of the invention is directed to a method for generating an output signal by an output stage responsive to a control signal, the output signal having a first state that enables normal operation of the receiving circuit, and a second state that resets the receiving circuit, the receiving circuit having a first supply terminal for receiving a supply voltage from a voltage supply source and second supply terminal for receiving a reference voltage from the voltage supply source. The output stage has a control node for receiving the control signal and an output node that outputs the output signal. The method includes the steps of (A) detecting a decrease in a voltage potential between the first supply terminal and the second supply terminal; (B) lowering a source of a transistor below ground potential thereby turning the transistor on, the transistor having a drain and a gate coupled to the control node and the second supply terminal, respectively; (C) discharging a charged capacitor that provides the control signal to the control node, the charge capacitor being discharged through the transistor; and (D) outputting the output signal having the second state when a voltage potential across the capacitor is less than a first predetermined threshold.

Another embodiment of the invention includes the step of outputting the output signal having the first state when the voltage potential across the capacitor is greater than a second predetermined threshold. Another embodiment of the invention includes the step of charging the capacitor that provides the control signal to the control node. Another embodiment of the invention includes the step of raising the gate voltage of a charging transistor above a third predetermined threshold thereby enabling the charging transistor to charge the capacitor. Another embodiment of the invention includes the step of operating a current mirror coupled to a resistive element, the gate voltage being across the resistive element. Another embodiment of the invention includes the step of disabling the current mirror when the potential difference between the first supply terminal and the second supply terminal is greater than a fourth predetermined threshold thereby reducing current consumption.

The characteristics and advantages of the POR circuit in accordance with the present invention are set forth in the description of an embodiment thereof given below by way of non-limiting example with reference to the annexed drawing.

BRIEF DESCRIPTION OF THE DRAWING

The drawing shows a diagram of a power-on reset circuit for reset of initial conditions in accordance with the present invention.

DETAILED DESCRIPTION

The diagram of a POR circuit in accordance with the present invention is shown in the figure in a form implementable with CMOS technology. The figure shows an input stage having a threshold circuit for which the input signal is the supply voltage. The supply line is designated by VDD in relation to ground GND.

In the input stage, two P_channel transistors T1 and T2 are disposed between the supply line VDD and ground in series with a condenser (or capacitor) C3 and an N-channel transistor T3 whose gate terminal is connected to VDD, respectively.

The transistors T1 and T2 are connected together in a current mirror configuration.

The threshold circuit further includes a P_channel transistor T4 which is inserted between an input node A of an output stage and the supply voltage VDD.

The gate terminal of the transistor T4 is connected to a circuit node F between the transistors T2 and T3 and through a condenser C2 to the power supply VDD.

The output stage is a trigger circuit with hysteresis having an inverter I1 inserted between the input node A and an output node U in a positive feedback loop that includes an N-channel transistor T5 between the input node A and ground.

The output node U is connected to the gate terminal of the transistor T5 and to the power supply VDD through a condenser C4.

Downstream from the output node U are two cascaded inverters I2 and I3 which are not an essential part of the circuit but serve to optimally form the generated signals. As in conventional power-on reset circuits, the feedback loop is grounded through a capacitive element.

In this case, it is advantageous to insert a condenser C1 between the input node A and ground.

An important feature of the present invention is that the node A and hence a terminal of the condenser is connected through an N-channel transistor to a circuit node B between a condenser C5 and a transistor T7 which are disposed between the power supply VDD and ground.

The gate terminals of the transistors T6 and T7 are connected to ground and the circuit node B, respectively.

Another important feature of the present invention for correct dynamic operation is that the transistors T2, T4, T5 and T6 are the so-called depletion type.

To analyze the operation of a POR circuit in accordance with the present invention, it is necessary to distinguish between the rising and falling ramps of the fast and slow power supply.

Regarding a FAST RISE RAMP: during rise of the power supply voltage VDD the gate of the transistor T4 and the output U of the inverter I1 remain anchored to the power supply since they are coupled to the condensers C2 and C4. The transistor T1 begins to conduct as soon as VDD>Vthp because of the capacitive coupling to ground of the condenser C3.

The transistor T2 appropriately mirrors the current generated by the transistor T1 in the drain of the transistor T3 which thus cannot carry to ground the gate of the transistor T4 which thus remains off.

In this manner, the input of the inverter I1 is kept grounded by the capacitance C1 and by the feedback of the transistor T5 while forcing the circuit output to the high logic level.

As soon as T1 has charged the condenser C3 at a voltage VDD−Vthp the current mirror shuts off and the transistor T3 can ground the gate of the transistor T4 which changes the state of the feedback loop while forcing the output of the circuit to the low logic level.

SLOW RAMP RISE: The gate of the transistor T1, which initially follows the rise of the voltage VDD unless there is a capacitive relationship, remains anchored to the value VDD −Vthp as soon as VDD>Vthp. In this manner, the mirror remains partly activated because T2 is a depletion transistor with threshold above Vthp (threshold of an implanted P_channel transistor). The transistor T3 is dimensioned in such a manner that it is resistive and carries the gate of the transistor T4 to a voltage equal to VDD less the threshold of a native P_channel transistor with a delay corresponding to the desired reset pulse time.

FALLING RAMP: Good operation during falling ramps in conventional circuits requires current consumption on standby during normal operation. To maintain null standby current and then be able to take back onto the capacitances in the POR circuits a charge quantity, such that the circuit can again release, is the result obtained with a POR circuit in accordance with the present invention. This happens also when the supply voltage is not grounded but at a voltage lower than the maximum voltage between the threshold voltage of an implanted N-channel MOS transistor (Vthn) and that of the implanted P-channel MOS transistor (Vthp).

A circuit in accordance with the present invention is capable indeed of discharging the capacitance C1 when the voltage VDD falls.

Indeed, the transistor T7 connected as a diode has the effect that during the falling ramp the condenser C5 charges to a value equal to VDD-Vthn. T6, a depletion N-channel transistor with threshold voltage Vthn-nat<Vthn is a switch which closes when the drain of the transistor T7 goes below ground by a value Vthn-nat. This value is less than the starting voltage of a diode.

A design condition for correct operation is that the capacitance of the condenser C5 be much greater (e.g., at least one order of magnitude) than that of the condenser C1.

It is clear that modification, integration and replacement of elements can be made to the embodiment described above by way of non-limiting example without thereby going beyond the protective scope of the following claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A reset circuit for resetting initial conditions of an integrated circuit device connected between a first supply terminal and a second supply terminal for coupling to a generator of a supply voltage variable from a low logic value to a high logic value, the circuit comprising:

an input stage having a first input terminal and a second input terminal coupled to the first supply terminal and the second supply terminal, respectively, and an output terminal, the input stage being a threshold circuit designed to control the output stage when the supply voltage exceeds a predetermined threshold value;

an output stage including an input node to generate command signals with hysteresis, and a positive feedback loop coupled to the input node and the second supply terminal, the output terminal of the input stage being coupled to the input node;

a first capacitive element coupled between the input node and the second supply terminal thereby coupling the input node to the second supply terminal;

a first transistor coupled between a second node and the input node, the first transistor having a command terminal coupled to the second supply terminal;

a second capacitive element coupled between the second node and the first supply terminal; and a second transistor coupled between the second node and the second supply terminal, the second transistor having a command coupled to the second node;

wherein the input stage further includes a third transistor and a third capacitive element connected in series between the first supply terminal and the second supply terminal;

a fourth transistor and a fifth transistor connected in series between the first supply terminal and the second supple terminal, the fifth transistor having a gate terminal connected to the first supply terminal, the third transistor and the fourth transistor being configured as a current mirror circuit configuration;

a sixth transistor coupled between the first supply terminal and the input node of the output stage, a gate terminal of the sixth transistor being coupled to a third node between the fourth transistor and the fifth transistor; and a fourth capacitive element coupled between the third node and the first supply terminal.

2. The reset circuit of claim 1, wherein both the third capacitive element and the fourth capacitive element are capacitors, and both the fourth transistor and the sixth transistor are the enhancement type.

3. A reset circuit for resetting initial conditions of an integrated circuit device disposed between a first supply terminal and a second supply terminal for coupling to a generator of a supply voltage variable from a low logic value to a high logic value, the circuit comprising:

an input stage having a first input terminal and a second input terminal coupled to the first supply terminal and the second supply terminal, respectively, and an output terminal, the input stage being a threshold circuit designed to control the output stage when the supply voltage exceeds a predetermined threshold value;

an output stage including an input node for generating command signals with hysteresis and a positive feedback loop coupled to the input node and the second supply terminal, the output terminal of the input stage being coupled to the input node;

a first capacitive element coupled between the input node and the second supply terminal thereby coupling the input node to the second supply terminal;

a first transistor coupled between a second node and the input node, the first transistor having a command terminal coupled to the second supply terminal;

a second capacitive element coupled between the second node and the first supply terminal; and a second transistor coupled between the second node and the second supply terminal, the second transistor having a command terminal coupled to the second node, wherein the output stage further includes a first inverter circuit coupled between the input node and an output node, the output node being coupled to the first supply terminal through, a fifth capacitive element, the output node being further coupled to a gate terminal of a seventh transistor of the feedback loop connected between the input node and second supply terminal; and wherein the input stage further includes a third transistor and a third capacitive element connected in series between the first supply terminal and the second supply terminal;

a fourth transistor and a fifth transistor connected in series between the first supply terminal and the second supply terminal, the fifth transistor having a gate terminal connected to the first supply terminal, the third transistor and the fourth transistor being configured as a current mirror circuit configuration;

a sixth transistor coupled between the first supply terminal and the input node of the output stage, a gate terminal of the sixth transistor being coupled to a third node between the fourth transistor and the fifth transistor; and a fourth capacitive element coupled between the third node and the first supply terminal.

4. A reset circuit for generating an output signal having a first state that enables operation of a receiving circuit that receives the output signal, and a second state that resets the receiving circuit, the receiving circuit having a first supply terminal for receiving a supply voltage from a voltage supply source and second supply terminal for receiving a reference voltage from the voltage supply source, the reset circuit comprising:

an output stage having a control node that receives a control signal, and an output node that generates an output signal according to the control signal;

a first condenser having a first end coupled to the control node, and a second end coupled to the second supply terminal;

a charging stage having an input terminal coupled to the first supply terminal to receive a potential difference between the supply voltage and the reference voltage, and a charging terminal coupled to the control node, the charging stage charging the first condenser when the potential difference increases above a first predetermined value; and a discharging stage having an input terminal coupled to the first supply terminal to receive the potential difference and a discharging terminal coupled to the control node, the discharging stage discharging the first condenser when the potential difference decreases below a second predetermined value, wherein the discharging circuit further includes a discharge stage condenser having a first end coupled to the first supply terminal, and a second end;

a first discharge stage transistor coupled between the discharging terminal and the second end of the discharge stage condenser the first discharge stage transistor further having a gate coupled to the second supply terminal; and a diode element having end coupled to the second end of the discharge stage condenser, and a second end coupled to the second supply terminal, wherein the diode element further includes a second discharge stage transistor coupled between the second end of the discharge stage condenser and the second supply terminal, the second discharge stage transistor having a gate coupled to the second end of the discharge stage condenser, wherein a connection between the second end of the discharge stage condenser and the first discharge stage transistor defines an intermediate node, and a drop in the potential difference between the first and second supply terminals enables an intermediate node voltage at the intermediate node to drop below the reference voltage thereby turning on the first discharge stage transistor to discharge the first condenser;

wherein the charging stage further includes a first input stage condenser having a first end, and a second end coupled to the second supply terminal;

a resistive element having a first end, and a second end coupled to the second supply terminal;

a current mirror having a first current mirror transistor coupled between the first supply terminal and the first end of the first input stage condenser, and a second current mirror transistor coupled between the first supply terminal and the first end of the resistive element, the first and second current mirror transistors each having a gate coupled to the first end of the first input stage condenser;

a second input stage condenser having a first end coupled to the first supply terminal, and a second end coupled to the first end of the resistive element; and a charging transistor coupled between the first supply terminal and the charging terminal, the charging transistor having a gate coupled to the first end of the resistive element.

5. The reset circuit of claim 4, wherein the output stage generates the output signal with hysteresis and further includes:

an output stage condenser having a first end coupled to the first supply terminal, and a second end to the output node;

an output stage inverter having an input coupled to the control node and an output coupled to the output node, and an output stage transistor disposed between the control node and the second supply terminal, and having a control gate coupled to the output node.

6. The reset circuit of claim 5, wherein the resistive element includes a resistive element transistor coupled between the second current mirror transistor and the second supply terminal.

7. The reset circuit of claim 6, further including:

a cascading inverter circuit having:

a first cascading inverter having a first end coupled to the output node, and a second end, and a second cascading inverter having a first end coupled to the second end of the first cascading inverter, and a second end that outputs a downstream signal.

8. A reset circuit for generating an output signal having a first state that enables operation of a receiving circuit that receives the output signal, and a second state that resets the receiving circuit, the receiving circuit having a first supply terminal for receiving a supply voltage supply source and second supply terminal for receiving a reference voltage from the voltage supply source, the reset circuit comprising:

an output stage having a control node that receives the control signal, and an output node that generates the output signal according to the control signal;

a first condenser having a first end coupled to the control node, and a second end coupled to the second supply terminal;

a charging stage having an input terminal coupled to the first supply terminal to receive a potential difference between the supply voltage and the reference voltage, and a charging terminal coupled to the control node, the charging stage charging the first condenser when the potential difference increases above a first predetermined value; and a discharging stage having an input terminal coupled to the first supply terminal to receive the potential difference, and a discharging terminal coupled to the control node, the discharging stage discharging the first condenser when the potential difference decreases below a second predetermined value;

wherein the charging stage further includes a first input stage condenser having a first end, and a second end coupled to the second supply terminal;

a resistive element having a first end, and a second end coupled to the second supply terminal;

a current mirror having a first current mirror transistor coupled between the first supply terminal and the first end of the first input stage condenser, and a second current mirror transistor coupled between the first supply terminal and the first end of the resistive element, the first and second current mirror transistors each having a gate coupled to the first end of the first input stage condenser;

a second input stage condenser having a first end coupled the first supply terminal, and a second end coupled to the first end of the resistive element; and a charging transistor coupled between the first supply terminal and the charging terminal, the charging transistor having a gate coupled to the first end of the resistive element.

9. The reset circuit of claim 8, wherein the output stage generates the output signal with hysteresis and further includes an output stage condenser having a first end coupled to the first supply terminal, and a second end coupled to the output node;

an output stage inverter having an input coupled to the control node and an output coupled to the output node, and an output stage transistor coupled between the control node and the second supply terminal, and having a control gate coupled to the output node.

* * * * *